United States Patent [19]

Weber

[11] Patent Number: 5,609,889

[45] Date of Patent: Mar. 11, 1997

[54] APPARATUS FOR ENCAPSULATING ELECTRONIC PACKAGES

[75] Inventor: Patrick O. Weber, San Jose, Calif.

[73] Assignee: Hestia Technologies, Inc., Sunnyvale, Calif.

[21] Appl. No.: 452,130

[22] Filed: May 26, 1995

[51] Int. Cl.⁶ .......................... B29C 45/02; B29C 45/14
[52] U.S. Cl. ...................... 425/116; 425/117; 425/544; 425/DIG. 228; 264/272.17; 264/275; 249/91; 249/95
[58] Field of Search ................................ 425/116, 117, 425/544, DIG. 228, 588; 264/272.17, 275; 249/91, 93, 95

[56] References Cited

U.S. PATENT DOCUMENTS

| | | | |
|---|---|---|---|
| 3,930,114 | 12/1975 | Hodge | 264/272.17 |
| 4,043,027 | 8/1977 | Birchler et al. | 29/588 |
| 4,437,141 | 3/1984 | Prokop | 361/403 |
| 4,455,274 | 6/1984 | Horney | 425/116 |
| 4,460,537 | 7/1984 | Heinle | 264/272.17 |
| 4,470,786 | 9/1984 | Sano et al. | 425/125 |
| 4,688,152 | 8/1987 | Chia | 361/408 |
| 4,778,641 | 10/1988 | Chia | 264/272.13 |
| 4,823,234 | 4/1989 | Konishi et al. | 361/386 |
| 4,859,722 | 8/1989 | Shiobara et al. | 523/433 |
| 4,861,251 | 8/1989 | Moitzger | 425/116 |
| 4,868,349 | 9/1989 | Chia | 174/52.4 |
| 4,890,152 | 12/1989 | Hirata et al. | 264/272.17 |
| 4,893,172 | 1/1990 | Matsumoto et al. | 357/79 |
| 4,935,581 | 6/1990 | Komathu | 174/52.4 |
| 4,954,877 | 9/1990 | Nakanishi et al. | 357/80 |
| 4,954,878 | 9/1990 | Fox et al. | 357/81 |
| 4,961,105 | 10/1990 | Yamamoto | 357/72 |
| 4,972,253 | 11/1990 | Palino et al. | 357/74 |
| 4,975,765 | 12/1990 | Ackermann et al. | 357/80 |
| 5,019,673 | 5/1991 | Juskey et al. | 174/52.2 |
| 5,049,526 | 5/1991 | McShane et al. | 264/272.17 |
| 5,093,282 | 3/1992 | Ohno et al. | 437/221 |
| 5,108,955 | 4/1992 | Ishida et al. | 249/97 |
| 5,132,778 | 7/1992 | Juskey et al. | 357/72 |
| 5,136,366 | 8/1992 | Worp et al. | 357/72 |
| 5,153,385 | 10/1992 | Juskey et al. | 174/260 |
| 5,191,511 | 3/1993 | Sawaya | 361/383 |
| 5,216,278 | 6/1993 | Lin et al. | 257/688 |
| 5,218,759 | 6/1993 | Juskey et al. | 29/840 |
| 5,241,133 | 8/1993 | Mullen, III et al. | 174/52.4 |
| 5,296,738 | 3/1994 | Freyman et al. | 257/684 |
| 5,328,870 | 7/1994 | Marrs | 437/216 |
| 5,355,283 | 10/1994 | Marrs et al. | 361/760 |
| 5,370,517 | 12/1994 | Casati et al. | 264/272.17 |
| 5,395,226 | 3/1995 | Sakai et al. | 425/116 |

FOREIGN PATENT DOCUMENTS 54-33665  3/1979  Japan ................. 264/272.17

OTHER PUBLICATIONS

E. Stephans, "Pinless Module Connector," *IBM Technical Disclosure Bulletin*, vol. __, No. 10:3872 (Mar. 1978).

Moore et al., "Solder Joint Reliability of Fine Pitch Solder Bumped Pad Array Carriers," pp. 264–274.

Primary Examiner—Khanh P. Nguyen
Attorney, Agent, or Firm—Burns, Doane, Swecker & Mathis, L.L.P.

[57] ABSTRACT

A printed wiring board with either a pin grid array, a ball grid array, a land grid array, etc. of electrical contacts is prepared with a heat sink attached in the usual manner. A passage is provided either in the printed wiring board or in the heat sink so that during the transfer molding process, fluid molding compound passes latitudinally under the heat sink into a cavity below the heat sink. The mold is provided with a biased plug that exerts pressure on the heat sink or printed wiring board to prevent molding compound from covering the heat sink. The biased plug also accommodates variations in the thickness of the printed wiring board.

4 Claims, 7 Drawing Sheets

APPARATUS FOR ENCAPSULATING ELECTRONIC PACKAGES

FIELD OF THE INVENTION

This invention relates in general to improved techniques for encapsulating objects, such as electronic devices and components and, more particularly, to an improved mold for the transfer molding of semiconductor or other electronic devices having heat sinks.

BACKGROUND OF THE INVENTION

In the fabrication of semiconductor and electronic devices there is an ongoing need to reduce packaging costs. Package sizing is also important, especially the profile or height of the package, when mounted to a printed wiring board or printed circuit board. Complicating the situation is the increasing complexity of electronic components such as integrated circuits which require a high pin count package to electrically connect the device to a user system.

Electronic circuits for complex systems such as digital computers typically are comprised of a multiplicity of interconnected integrated circuit chips. The integrated circuit chips are made from a semiconductor material such as silicon or gallium arsenide, and microscopic circuits are formed on the top surface of the chips by photolithographic techniques. In a conventional form of construction, the integrated circuit chips are mounted in respective ceramic packages, and the ceramic packages are mounted on a printed wiring board or printed circuit board.

Plastic integrated circuit packages have evolved as a cost effective replacement for ceramic packages. Modern laminate based molded plastic packages offer electrical, thermal and design performance that matches and often times exceeds that of ceramic packages at a lower cost. Electrically, laminate substrates have a clear advantage over co-fire ceramic with both lower resistance wiring and lower dielectric constant. Essentially, electrical designs can be implemented in less than half the volume (and half the number of layers) as an equivalent ceramic based design.

Plastic encapsulation of semiconductor and electronic devices by transfer molding is a well-known and much used technique. In a typical situation, a large number of components or devices are placed in an open multi-cavity mold, one or more devices in each cavity. When the mold is closed the two mold portions, usually called "platens" or "halves", come together around the devices. The many cavities in the mold are connected by a tree-like array of channels (i.e., runners) to a central reservoir (i.e., pot) from which the plastic is fed. Usually, "gates" (i.e., constricted channels) are placed just at the entrance to each cavity to control the flow and injection velocity of the plastic into the cavity, and to permit easier removal from the finished part of the material which has solidified in the runners.

Typically, powdered or pelletized plastic is placed in the central reservoir and compressed by a ram. The mold and reservoir are usually hot. The combination of heat and pressure causes the plastic to liquify and flow through the runner-tree and gates into the individual mold cavities, where it subsequently hardens. The mold halves are then separated and the encapsulated parts are removed and trimmed of excess plastic left in the runners and the gates.

Heat sinks have been added to plastic molded electronic packages as described in U.S. Pat. No. 4,868,349 issued to Chia. The heat sink provides more efficient heat removal in a plastic molded electronic package. The heat sink in Chia is attached in the following manner. A printed wiring board is prepared to have a plurality of package contacts (i.e., pins) secured to extend from one face in the form of a pin grid array. The printed wiring board has a cut-out region in its center and a copper heat sink is secured to the board to span the cut-out region on the opposite face of the board. A semiconductor (or electronic) device is then secured to the heat sink in the cavity created by the cut-out region. The bonding pads of the semiconductor device are then electrically connected to the traces on the printed wiring on the board that are joined to the package contacts. The printed wiring board of Chia is also provided with a plurality of holes located next to and outboard of the heat sink.

The assembly is then located in a transfer mold composed of a pair of opposing platens. A first platen has a first cavity that accommodates the package contacts and this cavity includes edges that bear against the printed wiring board adjacent to the pins. A second cavity is located in the first platen to span the holes in the board adjacent to the heat sink. The second or opposing platen has a cavity that spans the printed wiring board and is deep enough to accommodate the heat sink. It also contains a series of ribs that engage the printed wiring board so as to precisely locate it inside the platen and to press against the board periphery so as to force it against the first platen. It also contains runners and gates through which fluid plastic can be entered in a transfer molding process.

When fluid plastic is forced through the runners and gates, it enters the second cavity and covers the board adjacent to the heat sink but is precluded from coating the heat sink by virtue of contact with the platen cavity face. The fluid plastic fills the platen cavity around the heat sink and also flows through the holes in the board thereby to cover the semiconductor device inside the second cavity. The mold becomes filled with plastic which acts to encapsulate the printed wiring board and the housed semiconductor device. After transfer molding and partial cure of the encapsulant, the device can be removed from the mold and the cure completed. After curing, any flash is removed in the usual manner and the device is ready for use.

The Chia method has some particular advantages but likewise has certain limitations. First, the thickness of the printed wiring board can vary by as much as ±5 mils, whereas the height of the cavity between the first platen and second platen when they are brought together is fixed. The results being that if the printed wiring board is 5 mils too thick, as the mold is closed the heat sink and printed wiring board will be deflected into the second cavity, particularly because the heat sink width is smaller than the second cavity width, therefore there is no support below the printed wiring board in the heat sink area to resist the deflection. Then after the mold is opened, the pressure is released and the printed wiring board and heat sink return to their initial position. As a result, the heat sink is no longer flush with the top of the plastic encapsulant and cracks develop in the plastic at the heat sink-plastic interface. If the printed wiring board is 5 mils too thin, as the mold is closed there will be a 5 mil gap between the top of the heat sink and the inside surface of the cavity above the heat sink. As a result, plastic will flow over the heat sink and encapsulate it.

A second limitation of the Chia package is that the heat sink has to be relatively small so that the access holes through the board will be inboard of the package pin contacts but not covered up by the heat sink. The relatively small heat sink limits cooling of the package and limits the size of an external heat sink that a customer may wish to add to the package for additional cooling.

For integrated circuit (IC) plastic packaging, the IC chip is usually encapsulated because it is the lowest cost. Using a lid for encapsulating is typically used if the IC chip cannot tolerate the stresses of mold or liquid compound on the surface of the die. Encapsulation using liquid compound is another common method. This process is also known as "glob top" or potting.

The difference between glob top and potting methods is that the glob top is "self-crowning" liquid encapsulation. The potting method is more cosmetically appealing than the glob top method, but the potting method needs a "dam" or potting ring to prevent the encapsulating liquid from flowing in unwanted areas and therefore adds cost. The potting ring is typically separate from the printed wiring board and attached using an adhesive. Because the potting ring is separate from the printed wiring board, there is added cost of handling two individual pieces and the adhesive to make it one unit. An alternative method of applying a potting ring is screen printing. However, there are height and height tolerance limitations.

SUMMARY OF THE INVENTION

It is an object of the present invention to overcome the limitations of the prior art devices and methods. One object of the present invention is to provide a method and a mold to produce a molded package that has superior heat transfer characteristics. It is another object of the present invention to provide a method and a mold that produces high yield for the manufacture of transfer molded electronic packages having heat sinks attached. Another object of the present invention is to provide a cost-effective method and mold for producing a potting ring on an encapsulated package.

These and other objectives are achieved in the following manner. A printed wiring board with either a pin grid array, a ball grid array, a land grid array, etc. of electrical contacts is prepared with a heat sink attached in the usual manner. A passage is provided either in the printed wiring board or in the heat sink so that during the transfer molding process, fluid molding compound passes latitudinally under the heat sink into a cavity below the heat sink. The mold is provided with a biased plug that exerts pressure on the heat sink or printed wiring board to prevent molding compound from covering the heat sink. The biased plug also accommodates variations in the thickness of the printed wiring board.

In accordance with one embodiment of the present invention, there is provided an apparatus for encapsulating a substrate having a heat sink thereon, comprising separable mold portions having therein at least one mold cavity adapted to receive the substrate and the heat sink, and biasing means for urging at least part of one of said mold portions into contact with the heat sink such that mold compound entering the apparatus is prevented from covering a surface of the heat sink in contact with the mold portion.

In accordance with another embodiment of the present invention, there is provided a transfer mold for encapsulating a substrate having a heat sink attached thereto, comprising a first mold platen having a recess containing a plug and biasing means therein, and a second mold platen for mating with the first mold platen to form a mold cavity for receiving the substrate and heat sink, said plug being biased against the heat sink when the substrate is located between the mated first mold platen and second mold platen.

BRIEF DESCRIPTION OF THE INVENTION

Many objects and advantages of the present invention will be apparent to those of ordinary skill in the art when this specification is read in conjunction with the attached drawings wherein like reference numerals are applied to like elements and wherein.

DETAILED DESCRIPTION OF THE PREFERRED EMBODIMENTS

Figure 1:
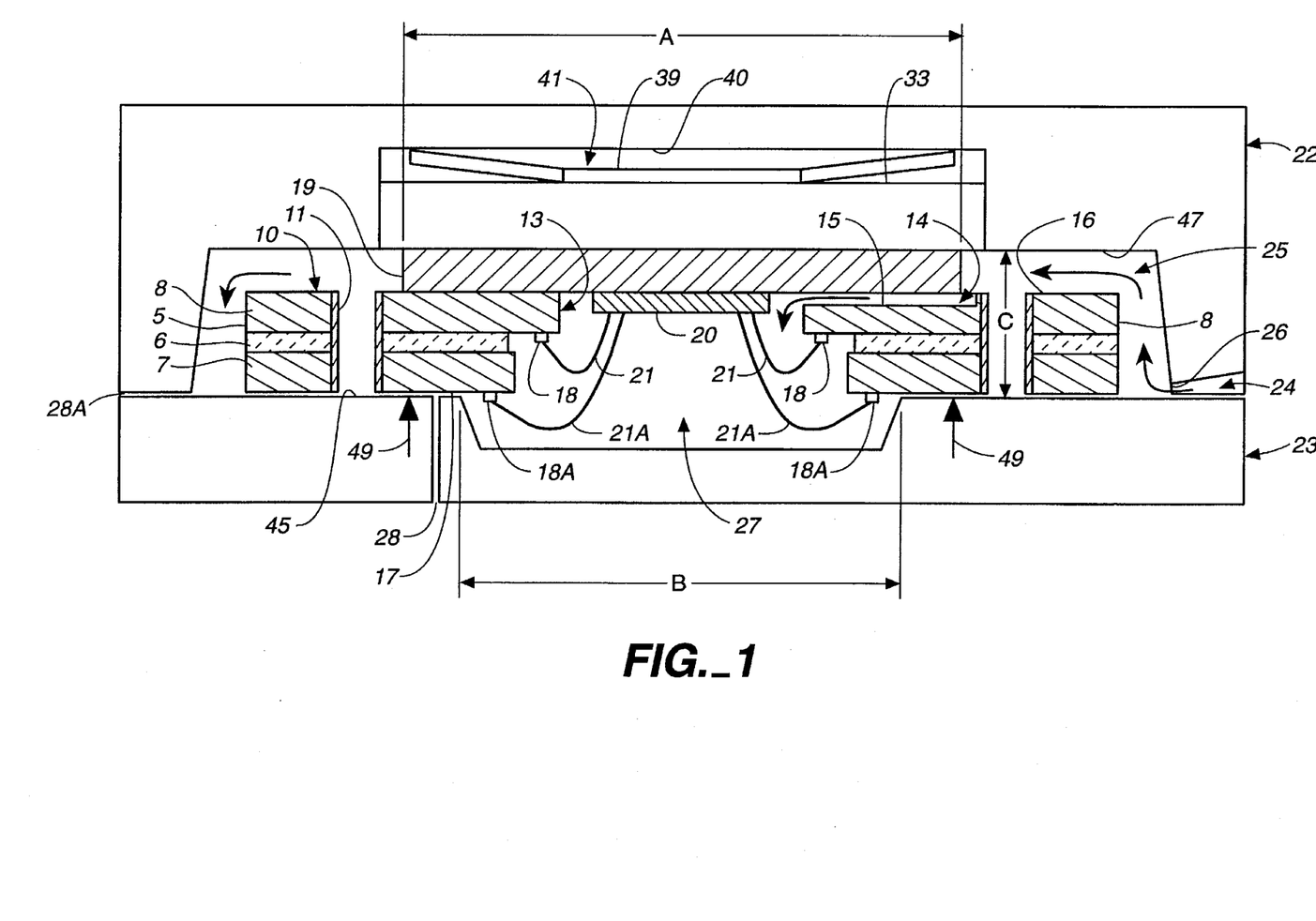
FIG. 1 is a cross-sectional view of a substrate in a transfer mold in accordance with one embodiment of the present invention.

With reference to FIG. 1, the starting element is a laminated substrate 10. Substrate 10 is a conventional printed wiring board (PWB), typically of the multi-layer variety. It includes a series of plated vias (i.e., through holes) 11 into which electrical contacts (e.g., solder balls, pads, pins, etc.) are secured usually by soldering to form a ball grid array, pin grid array, land grid array, etc. A window 13 is cut through the center of the PWB. In the particular embodiment of FIG. 1, window 13 passes through layers 5, 6 and 7 with the portion in layers 6 and 7 being larger than the portion in layer 5.

Passage or feed means 14 is provided in substrate 10. In FIG. 1, passage means 14 is a slot or channel 15 cut in the top surface 16 of substrate 10 (see FIG. 2 in which the via holes are not shown for simplicity). However, it is important to note that the passage means can be, but not limited to, a hole, a groove, orifice, duct, notch or any number of configurations that allow fluid molding compound (e.g., plastic) to pass latitudinally under heat sink 19. Latitudinal for the present invention includes movement that is generally side to side, including length-wise or width-wise movement as opposed to height-wise or thickness-wise movement. However, latitudinal also includes angular side to side movement that can be represented by a passage that extends transversely through the substrate at the same time as descending through the thickness (i.e., the height) of the substrate. Likewise, angular side to side movement can be represented by a passage that extends transversely through the substrate and at the same time have an increasing depth (i.e., channel depth). As will be discussed below, the passage means can also extend latitudinally for a distance and then connect with a vertical passage through the substrate.

As will be described later in more detail, passage means 14 plays an important role in the molding process, in particular it allows for the improvements of the present invention over the prior art. Heat sink 19 is secured to top surface 16 of substrate 10 over window 13. Heat sink 19 is typically a slab of copper covered with a thin anticorrosion nickel or gold plate and is secured to substrate 10 by an adhesive. Substrate 10 includes conductive traces that join vias 11 to an array of bond fingers on bottom surface 17 of the board that surround the periphery of hole 13. Once heat sink 19 is secured to substrate 10 the package forms a cavity available from the bottom side or surface 17 for mounting an electronic device 20 therein.

Electronic device 20 is typically a chip having an integrated circuit on the top thereof, but can be other active devices such as diodes, transistors, etc. Likewise, multiple chips or other devices can be attached to one laminated substrate. In one embodiment, the integrated circuit of electronic device 20 is attached to the laminated substrate by bonding wires 21 from bonding pads on the top of the chip to bond fingers 18 on one tier of the laminated substrate and by bonding wires 21A to bond fingers 18A on a second tier of the laminated substrate. The bonding wires are typically 25 micrometer diameter gold wires, however as one of ordinary skill in the art is aware various diameters and materials, such as aluminum or other metals, can be used especially for high- current-power devices.

In one embodiment, the wires are bonded to the bond fingers using a thermosonic bonding process which uses a combination of heat (approximately 150° C. to 200° C.) and ultrasonics (approximately 60 to 70 kHz) to obtain a good mechanical bond and a very low resistance electrical contact. An ultrasonic bonding process which uses just ultrasonics (approximately 60 to 70 kHz) can also be used. In the thermosonic and similar types of bonding processes, the end of the wire becomes expanded to about two to three times its original diameter; so the large bond fingers are advantageous. After the electronic device has been attached, the laminated substrate can be used in a conventional plastic package to encapsulate the electronic device. A substrate for use with the present invention is disclosed in copending U.S. patent application Ser. No. 08/452,024 filed concurrently herewith as Attorney Docket No. 011608-011 and entitled "METHOD OF TRANSFER MOLDING ELECTRONIC PACKAGES AND PACKAGES PRODUCED THEREBY" which is commonly owned and incorporated herein by reference in its entirety.

The following is an example of the practice of the present invention. Those of skill in the art will recognize that other embodiments of the present invention are also suitable. Lower platen 23 is placed in a mold press and substrate 10 is placed over lower platen 23. Upper platen 22 is aligned over lower platen 23 so that upper mold cavity 25 and lower mold cavity 27 are formed surrounding substrate 10. FIG. 1 shows the substrate located between mold platens 22 and 23, which are employed in the transfer molding operation. As used herein the words "upper platen" and "lower platen" or "upper mold platen" and "lower mold platen" refer to the two separable portions of the mold used to define the enclosed mold cavities in which molding is to occur. The words "upper" and "lower" are used for ease of description and do not imply a required orientation in space, since the molds may be readily designed to operate in either top transfer (ram on top) or bottom transfer (ram on bottom) configurations without affecting their basic function. All of the figures only show a single position in the transfer mold which would ordinarily involve a plurality of such positions so that a relatively large number of devices can be simultaneously molded. Well known mold features such as ejector pins which facilitate removal of the finished part(s) are omitted for clarity. Those of skill in the art will recognize that such a feature and/or others may be used in practice. The transfer mold is employed in a conventional transfer molding process. Alignment bumps 43 can be provided on substrate 10 to center the substrate in the platen.

In the transfer molding operation, a predetermined volume of fluid (heated) molding compound at least sufficient to fill the net volume of mold cavities 25 and 27 plus the volume of transfer means 14 and via holes 11 is forced into hole 24 at approximately 500 psi. The molding compound is typically a thermoset plastic. The molding compound can be any of a number of materials known to one of ordinary skill in the art, including but not limited to those disclosed in Sporck, U.S. Pat. No. 3,838,094, Shiobara et at., U.S. Pat. No. 4,859,722, and Jusky et al., U.S. Pat. No. 5,132,778, all of which are incorporated herein in their entirety.

The fluid molding compound passes into upper mold cavity 25 through gate 26. In upper mold cavity 25, the arrows show the resulting molding compound flow. The molding compound flows around heat sink 19, over upper surface 16 of substrate 10 and around sides 8 of substrate 10 to encapsulate the top and sides of the package. It is important that the velocity at which the liquid molding compound is injected into the mold cavities be controlled so as not to exceed a maximum injection velocity. The limit on the maximum injection velocity is required in order to avoid forming voids in the molding compound or having the rapidly moving molding compound damage fragile elements of the electronic device, such as bonding wires 21,21A or the semiconductor chip. The maximum injection velocity may be readily determined by experiment. It is also important that the injection molding time be less than the solidification time. This second requirement imposes a lower limit upon the injection velocity.

As mentioned above, passage means 14 provides particular advantages. Passage means 14 allows fluid molding compound to move latitudinally or laterally under heat sink 19 through substrate 10 into lower mold cavity 27 in lower mold platen 23 to encapsulate electronic device 20, bonding wires 21, 21A, and bond fingers 18, 18A. The latitudinal movement of molding compound under the heat sink means that a large heat sink can be placed over the top of the package for greater heat transfer. In fact, the heat sink could cover the entire top surface of the substrate whereby passage means 14 would extend all the way to the side of the substrate.

Figure 2:
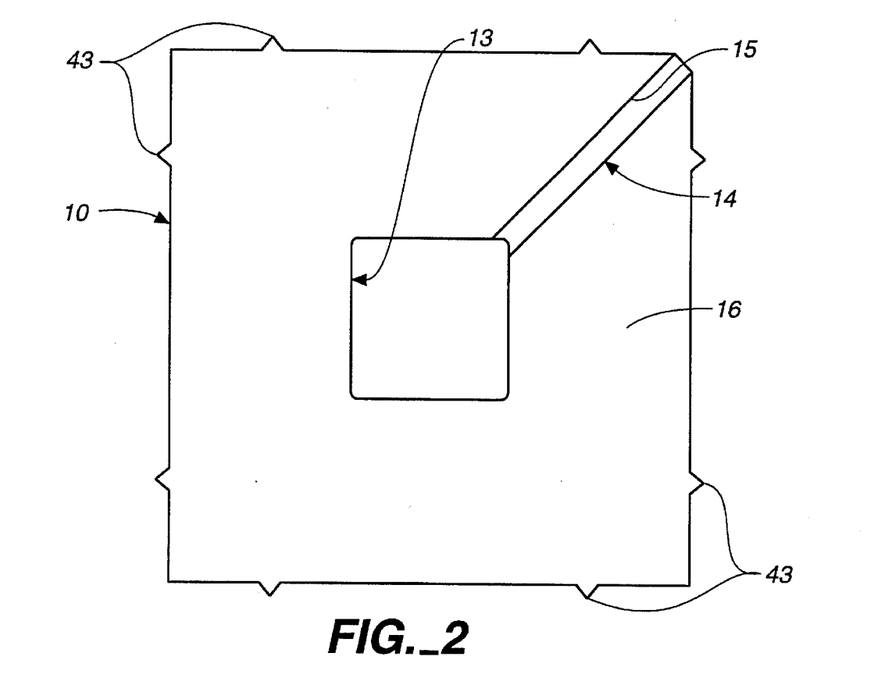
FIG. 2 is top plan view of the substrate of FIG. 1.

Passage means 14 has a variable size. The passage can be wide and shallow or, alternatively, skinny and deep. The important characteristic is to have a cross-sectional area that is of a proper size to prevent spiral flow or blockage in the passage. Preventing these events is well within the ordinary skill of one skilled in the art. For example, a typical size can be 20 mils deep and 60 mils wide resulting in a cross-sectional area of 1200 square mils. Variations in the size of the passage can be made depending on, but not limited to, such factors as: dimensions of mold cavity; dimensions of substrate and heat sink; viscosity of molding material; composition of molding material; etc. It is preferable that there be no circuitry or via holes below the passage. However, a passage can pass through via holes without a problem. As shown in FIG. 2, passage means 14 runs diagonally from the corner of the substrate to window 13. However, the passage means can run from any direction in the substrate and need not extend all the way to the edge or to the window as will be discussed in more detail below. There can also be more than one passage means in accordance with another embodiment of the present invention.

The upper platen 22 includes a plug 33 that presses against heat sink 19 so as to preclude molding compound from flowing over the upper portion of the heat sink. Plug 33 is pressed against heat sink 19 using biasing means 39 located in cavity 41 of upper platen 22. Biasing means 39 also presses substrate 10 onto surface 45 of lower platen 23 so that molding compound is prevented from flowing across the bottom surface of the substrate except in the area of mold cavity 27. A spacer (not shown) can be placed in cavity 41 between biasing means 39 to adjust the amount of pressure the biasing means exerts against heat sink 19. Likewise, the biasing means can be changed out with a biasing means of different strength.

The use of a relatively large heat sink 19 (i.e., having a greater width than the width of the mold cavity) in the molding process of the present invention has particular advantages over the prior art. As can be seen in FIG. 1, heat sink width A is greater than mold cavity width B. In addition, plug 33 has a greater width than the heat sink. As a result, when upper mold platen 22 and lower mold platen 23 are brought together, substrate 10 is supported by the lower mold platen (illustrated by arrows 49 in FIG. 1) as biased plug 33 exerts force on the substrate through heat sink 19. In this way, the center portion of the substrate will not deflect (as it does in the prior art) because the pressure of the plug is transmitted from the heat sink directly through the board to the lower platen (instead of being transmitted through the board to an open mold cavity where there is no structure to support it).

The biased plug adds another particular advantage in that the biasing means 39 can compensate for any tolerance variations in the thicknesses of the substrate and/or heat sink. As can be seen in FIG. 1, height C between top surface 45 of lower platen 23 and top surface 47 of upper platen 22 is a fixed distance when the two platens are brought together for the molding process. However, the thickness of the substrate and/or heat sink can vary by several mils. These variations are compensated for with biasing means 39. For example, if the substrate is too thick, heat sink 19 deflects biasing means 39 and plug 33 upward so that undue pressure is not exerted on the substrate as the two platens are brought together. On the other hand, if substrate 10 is too thin, biasing means 39 deflects and forces plug 33 downward onto the upper surface of heat sink 19, thus preventing a gap between the lower surface of the upper platen and the upper surface of the heat sink wherein molding compound might have flowed over the heat sink.

In the transfer molding art, it is a good rule of thumb that the fluid molding compound will not flow into a gap or recess smaller than about 0.025 min. Thus, vents 28 and 28A having a diameter of about 0.01 mm will relieve air pressure within the mold while precluding the flow of molding compound therethrough.

Figure 3:
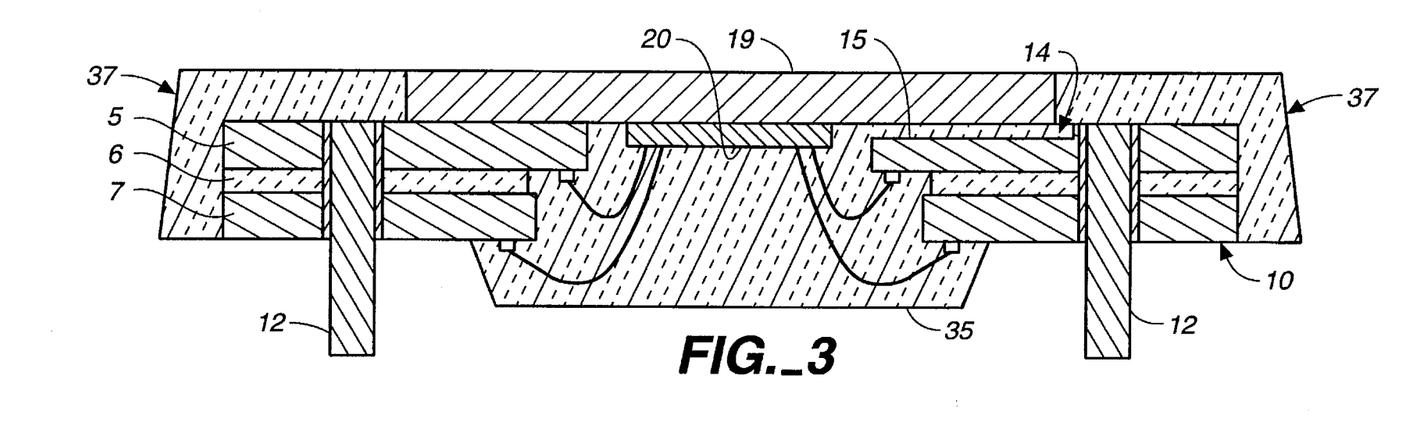
FIG. 3 is an encapsulated electronic package in accordance with one embodiment of the present invention.

The finished transfer molded pin grid-array is shown in FIG. 3 in cross-section. The molded package typically starts to cure in the mold. Then, the package is removed from the mold and cured or cross-linked at about 175° C. for four hours. The molding compound hardens into encapsulant 37 that surrounds the top surface and sides of substrate 10, as well as covers the electronic device, bonding wires and bond figures. Electrical contacts (i.e., pins) 12 are secured in vias 11 by soldering usually.

Figure 4:
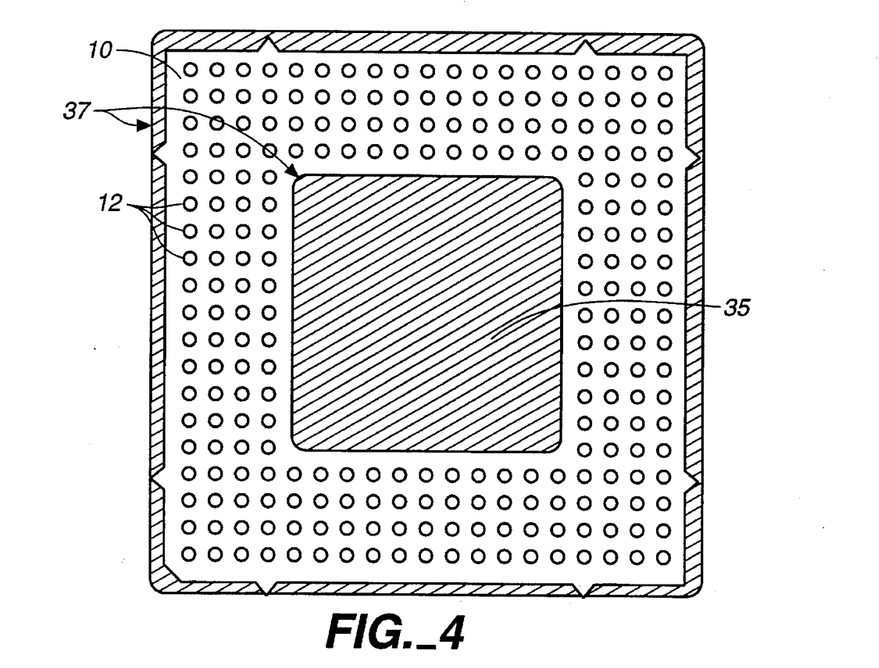
FIG. 4 is a bottom plan view of the electronic package of FIG. 3.

FIG. 4 is a bottom view of the finished transfer molded pin grid array package illustrating that the encapsulant fills the center cavity to encapsulate the electronic device therein and extends over and around the edges of the substrate. In another embodiment of the present invention, solder balls are attached to the via holes to form a ball grid array. Likewise, land grid arrays and other contact configurations can be formed in accordance with the present invention.

The lower platen 23 also can have recesses (not shown in FIG. 1) located at the four corners of lower mold cavity 27. The molding compound can then form protrusions (not shown) from the bottom surface 35 of encapsulant 37 so that when the package is mounted on a conventional printed circuit board it will seat with the protrusions in contact with the board while the central portion of encapsulant 37 will clear the board surface. Because the protrusions are located at the four corners of the package the central region is accessible to cleaning fluid after the package is soldered in final assembly.

Referring back to FIG. 1, it is to be understood that while heat sink 19 is shown as a flat slab, it can take other forms. For example, an integral threaded boss can be included on the top of the heat sink. Such a boss can facilitate the attachment of heat fins or some other form of cooling mechanism. When such a boss is present on heat sink 19 the plug 33 will contain an accommodating recess for the boss. Whether such a boss and recess is present, the close spacing between heat sink 19 and plug 33 around the periphery of the heat sink will preclude molding compound from covering the heat sink face during molding.

Figure 5:
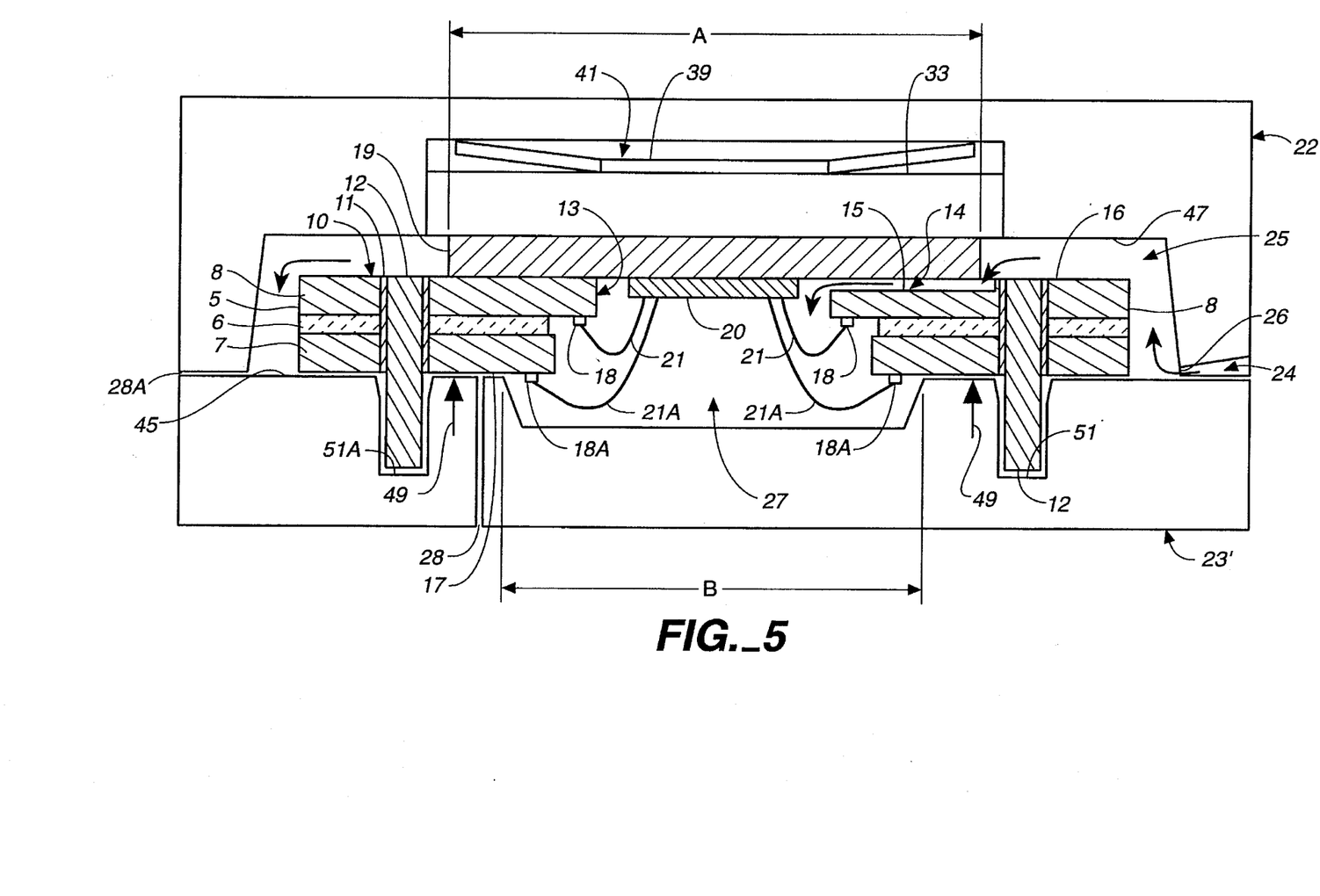
FIG. 5 is a cross-sectional view of a substrate in a transfer mold in accordance with another embodiment of the present invention.

In one embodiment of the present invention, lower platen 23' can be used. Lower platen 23' (FIG. 5) has a plurality of recesses or cavities 51, 51A for receiving electrical contacts 12. The upper platen in this embodiment is identical to the upper platen discussed previously and the molding process is the same. The electrical contacts in the recesses can be used to center the substrate, therefore, there is no need for other elements (such as alignment bumps 43 in FIG. 2) to be used for alignment purposes.

Figure 6:
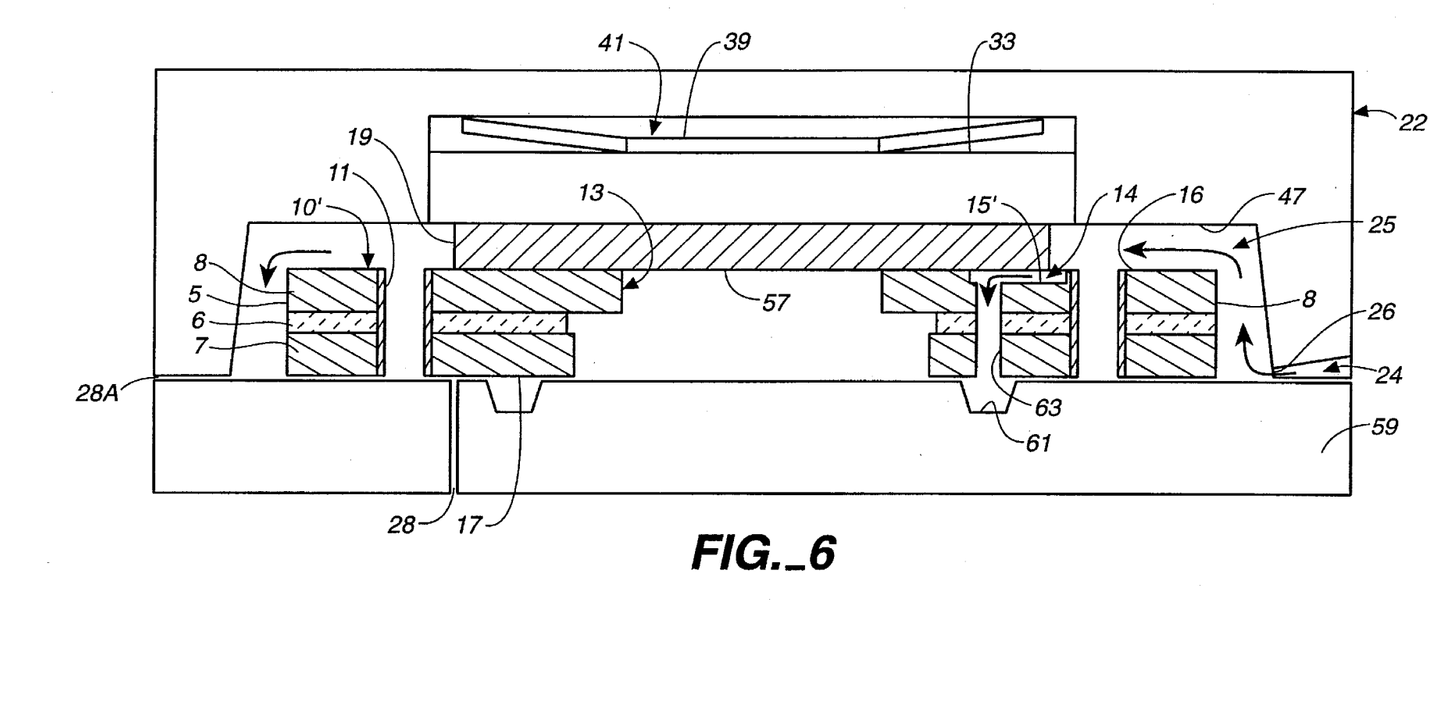
FIG. 6 is a cross-sectional view of a substrate in a transfer mold in accordance with yet another embodiment of the present invention.
Figure 9:
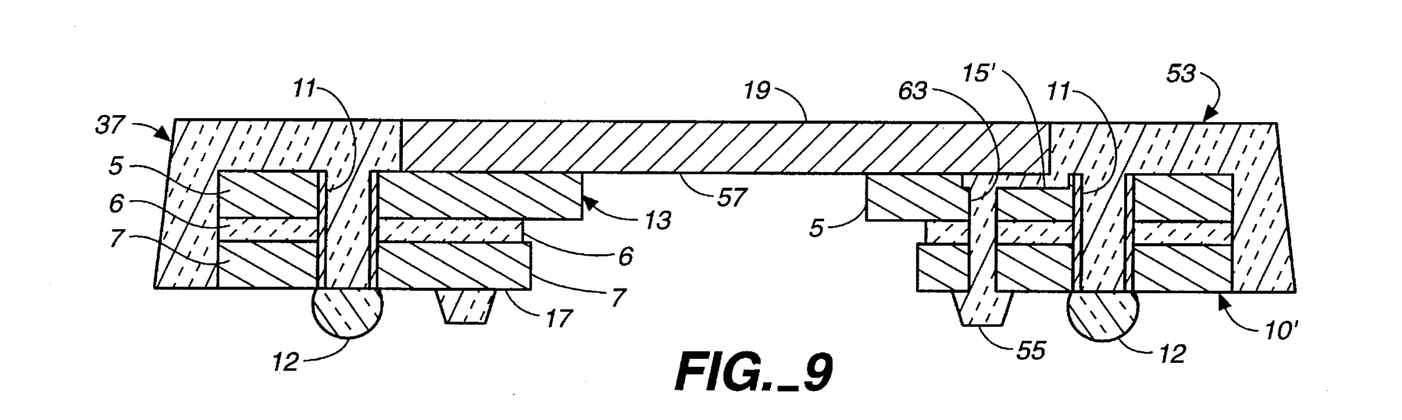
FIG. 9 is an encapsulated package with a molded potting ring in accordance with one embodiment of the present invention.

Another embodiment of the present invention is shown in FIG. 6, upper platen 22 is the same as described above but the lower platen and passage means are different for the purpose of forming a potting ring on bottom surface 17 of substrate 10' instead of encapsulating an electronic device. Potting ring (or dam ring) 55 is formed on the bottom of substrate 10' at the same time that encapsulant 37 is formed around the heat sink and sides of the substrate so that encapsulated package 53 can be used for the later attachment of an electronic device to bottom surface 57 of heat sink 19 and encapsulated with a liquid encapsulant (FIG. 9). Dam ring 55 prevents the liquid encapsulant from spreading to undesired areas before it hardens. As a result of molding the potting ring to the substrate, there is no need for handling a potting ring separate from the substrate. Some of the advantages are: lower cost due to less material and material handling; no limitations on potting ring height and tolerance; and better cosmetics of the molded package.

As mentioned above, the lower platen used for this embodiment is slightly different than lower platens 23 and 23' discussed previously. Lower platen 59 in FIG. 6 has a ringed mold cavity 61 formed therein. Typically, mold cavity 61 is square or rectangular shape to match the shape of window 13 in the substrate, however, the mold cavity can be round or any other shape. Likewise, the cross-section of the mold cavity is similar to an inverted, truncated pyramid but the cross-section could be any of a large number of shapes. Lower platen 59 and relatively large heat sink 19 have the same particular advantages as discussed above such as preventing deflection in the center of the substrate.

Figure 7:
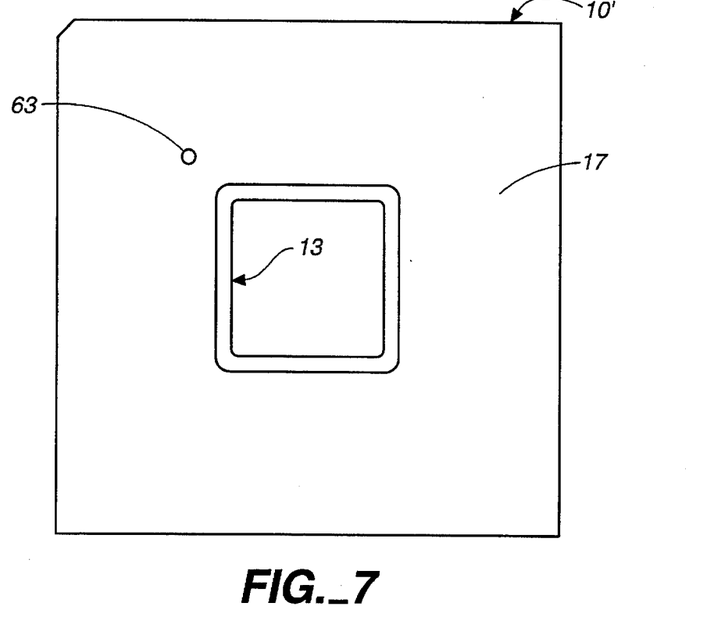
FIG. 7 is a bottom plan view of the substrate of FIG. 6.
Figure 8:
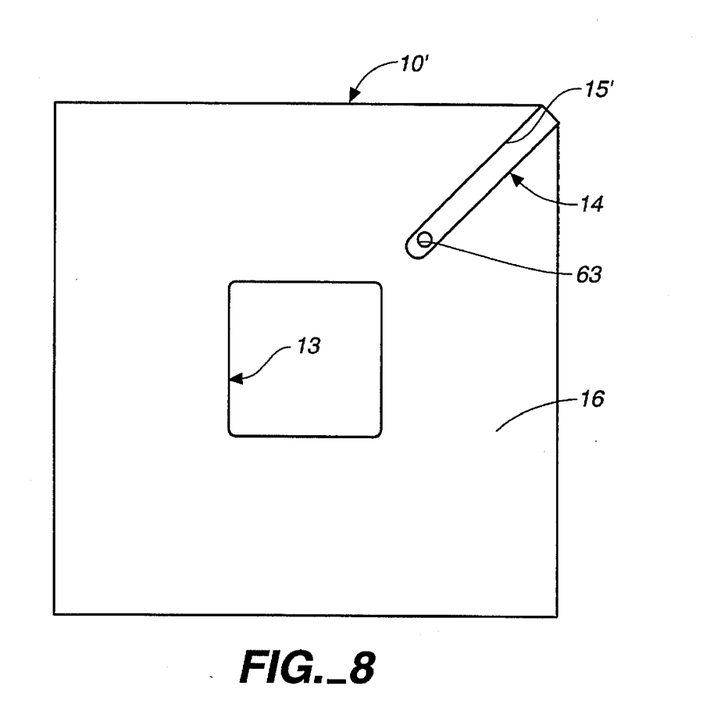
FIG. 8 is a top plan view of the substrate of FIG. 6.

Passage means 14 in substrate 10' is a shortened passage or groove 15' (of similar configuration and size as passage 15 discussed previously) and opening 63 extending through substrate 10' from passage 15' to second surface 17 of the substrate. FIG. 8 is top view of substrate 10' before encapsulation showing passage 15' extending from the corner of the substrate to opening 63. As before, passage 15' can run from any direction in the substrate and need not extend all the way to the edge of the substrate. There can also be more than one passage means in accordance with another embodiment of the present invention. FIG. 7 is a bottom view of substrate 10' extending through bottom surface 17 of the substrate.

Passage 15' traverses latitudinally under heat sink 19 to opening 63. The heat sink could cover the entire top surface of the substrate whereby passage means 14 would extend all the way to the side of the substrate. Potting ring 55 is molded by incorporating the opening through the substrate inside the passage area. FIG. 6 shows that during the molding process, the fluid molding compound passes into upper mold cavity 25 through gate 26. In upper mold cavity 25, the arrows show the resulting molding compound flow. The molding compound flows around heat sink 19, over upper surface 16 of substrate 10 and around sides 8 of substrate 10' to encapsulate the top and sides of the package. The molding compound flows around the edges and top surface of substrate 10' into passage 15' and down through opening 63 into mold cavity 61. FIG. 9 shows the completed encapsulated package 53 with molded potting ring 55. Electrical contacts 12 in the form of solder balls to form a solder ball grid array have been electrically connected to via holes 11. Electrical contacts 12 could be pins, lands, etc. as known in the art.

Figure 10:
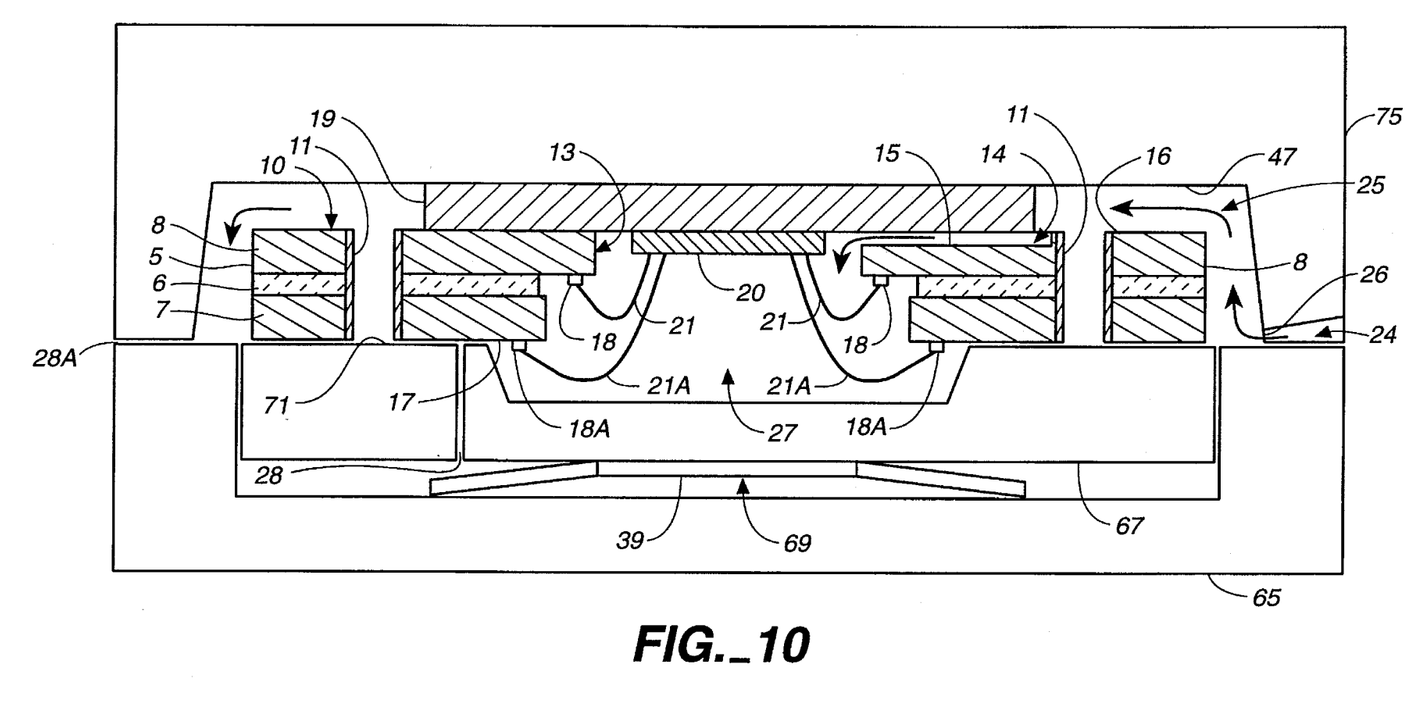
FIG. 10 is a cross-sectional view of a substrate in a transfer mold in accordance with another embodiment of the present invention.

In yet another embodiment of the present invention, lower platen 65 can be used for the molding process (FIG. 10). Lower platen 65 includes plug 67 that presses against lower surface 17 of substrate 10 such that the top surface of heat sink 19 is pressed into contact with surface 47 of upper mold cavity 25 in upper platen 75 so as to preclude molding compound from flowing over the top surface of the heat sink. Plug 67 is biased using biasing means 39 located in cavity 69 of lower platen 65. Biasing means 39 also presses surface 71 of plug 67 against surface 71 of substrate 10 so that molding compound is prevented from flowing across the bottom surface of the substrate except in the area of mold cavity 27. Plug 67 is dimensioned to fit in cavity 69 with a gap of less than about 0.01 mm along either side so that molding compound will not flow into cavity 69 during the molding process. The use of the relatively large heat sink 19 (i.e., having a greater width than the width of the mold cavity) and plug 67 in the molding process of the present embodiment has the same advantages as discussed above, such as compensating for variations in the thicknesses of the heat sink and substrate and preventing deflection in the center of the substrate. It is important to note that biased plug 67 could have a mold cavity like cavity 61 for forming a potting ring instead of mold cavity 27. Likewise, plug 67 could have recesses for accommodating pins or other electrical contacts as discussed with reference to the embodiment of FIG. 5.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made other than those discussed by workers of ordinary skill in the art without departing from the scope of the present invention as defined by the following claims.

The invention claimed is:

1. An apparatus for encapsulating a laminate substrate having a heat sink thereon, comprising:

a first mold platen having a recessed portion;

a second mold platen for mating with the first mold platen to form a mold cavity adapted to receive the laminate substrate with the heat sink thereon, the second mold platen having a recessed portion and a support surface surrounding the recessed portion for supporting the laminate substrate;

a member located in a cavity contiguous with the recessed portion in the first mold platen, the member having a width greater than the recessed portion of the second mold platen; and biasing means located in the contiguous cavity for urging the member into contact with the heat sink such that mold compound entering the apparatus is prevented from covering a surface of the heat sink in contact with the member and holding the laminate substrate flat against the support surface of the second mold platen.

2. The apparatus of claim 1 further comprising:

at least one depression in the support surface of the second mold platen for receiving electrical contacts extending from the laminate substrate.

3. The apparatus of claim 1 wherein the recessed portion of the second mold platen is an annular cavity.

4. The apparatus of claim 1 wherein the recessed portion of the second mold platen forms a second mold cavity.

\* \* \* \* \*

UNITED STATES PATENT AND TRADEMARK OFFICE
CERTIFICATE OF CORRECTION

PATENT NO. : 5,609,889
DATED : March 11, 1997
INVENTOR(S) : Patrick O. Weber

It is certified that error appears in the above-indentified patent and that said Letters Patent is hereby corrected as shown below:

In column 6, line 51, after "be", delete bold "20" and insert --20--; and

Column 7, line 49, after "0.025", delete "min.", and insert --mm--.

Signed and Sealed this

Fifteenth Day of July, 1997

Attest:

BRUCE LEHMAN

Attesting Officer

Commissioner of Patents and Trademarks